US012700869B2

(12) United States Patent
Bako et al.

(10) Patent No.: US 12,700,869 B2
(45) Date of Patent: Aug. 4, 2026

(54) PHASE-LOCKED LOOP

(71) Applicant: ams-OSRAM AG, Premstaetten (AT)

(72) Inventors: Niko Bako, Zagreb (HR); Gregor Schatzberger, Graz (AT); Ivan Brezovec, Graz (AT)

(73) Assignee: ams-OSRAM AG, Premstaetten (AT)

( * ) Notice: Subject to any disclaimer, the term of this patent is extended or adjusted under 35 U.S.C. 154(b) by 28 days.

(21) Appl. No.: 18/874,041

(22) PCT Filed: Apr. 4, 2023

(86) PCT No.: PCT/EP2023/058739
§ 371 (c)(1),
(2) Date: Dec. 11, 2024

(87) PCT Pub. No.: WO2023/247081
PCT Pub. Date: Dec. 28, 2023

(65) Prior Publication Data
US 2025/0373252 A1        Dec. 4, 2025

(30) Foreign Application Priority Data

Jun. 23, 2022    (DE) ..................... 10 2022 115 668.0

(51) Int. Cl.
*H03L 7/099*        (2006.01)
*H03L 7/089*        (2006.01)

(52) U.S. Cl.
CPC .......... *H03L 7/0995* (2013.01); *H03L 7/0893* (2013.01); *H03L 7/0992* (2013.01)

(58) Field of Classification Search
CPC ..... H03L 7/0995; H03L 7/099; H03L 7/0992; H03L 7/00; H03L 7/06; H03L 7/08; H03L 7/089; H03L 7/0891; H03L 7/0893
USPC ................ 327/147, 148, 150, 156, 157, 159
See application file for complete search history.

(56) References Cited

U.S. PATENT DOCUMENTS

| | | | |
|---|---|---|---|
| 11,791,829 B2 * | 10/2023 | Zhu ......................... | H03L 7/083 375/376 |
| 12,063,044 B2 * | 8/2024 | Lee ......................... | H03L 7/093 |
| 2009/0085679 A1 | 4/2009 | Jennings et al. | |
| 2019/0028108 A1 | 1/2019 | Gao et al. | |

OTHER PUBLICATIONS

International Search Report issued in corresponding International Application No. PCT/EP2023/058739 dated Jul. 14, 2023.

(Continued)

*Primary Examiner* — Hai L Nguyen
(74) *Attorney, Agent, or Firm* — ArentFox Schiff LLP

(57) ABSTRACT

A phase-locked loop circuit comprises an analog part, an integral part, and a voltage controlled oscillator configured to receive a first current signal from the analog part and a second current signal from the integral part, and to output an output clock. The integral part is configured to receive a first and a second update signal each having at least one state based on a phase difference between an input clock and the output clock. The integral part comprises three integrator cells interconnected to form a ring oscillator.

16 Claims, 6 Drawing Sheets

(56) References Cited

OTHER PUBLICATIONS

Wenjing Yin et al: "A 1.6mW 1.6ps-rms-jitter 2.5GHz digital PLL with 0.7-to-3.5Ghz frequency range in 90nm CMOS", Custom Integrated Circuits Conference (CICC), 2010 IEEE, IEEE, Piscataway, NJ, USA, Sep. 19, 2010 (Sep. 19, 2010), pp. 1-4, XP031786851 ISBN: 978-1-4244-5758-8 paragraph [000I]-paragraph [000v] figures 1-8.
Zhu Junheng et al: "A 0.0021 mm2 1.82 mW 2.2 Ghz PLL Using Time-Based Integral Control in 65 nm CMOS" IEEE Journal of Solid-State Circuits, IEEE, USA, vol. 52, No. 1, Jan. 1, 2017 (Jan. 1, 2017), pp. 8-20, XP011638624, ISSN: 0018-9200, DOI: 10.1109/ JSSC.2016.2598768 [retrieved on Jan. 9, 2017] paragraph [0001]- paragraph [0VII]; figures 1-25.
Kim Dongin et al: "A Hybrid PLL Using Low-Power GRO-TDC for Reduced In-Band Phase Noise", IEEE Transactions on Circuits and Systems II: Express Briefs, IEEE, USA, vol. 66, No. 2, Feb. 1, 2019 (Feb. 1, 2019), pp. 232-236, XP011707363, ISSN: 1549-7747, DOI: 10.1109/TCSII.2018.2848218 [retrieved on Jan. 28, 2019] para- graph [000I]-paragraph [000v]; figures 1-12.

* cited by examiner

PHASE-LOCKED LOOP

CROSS REFERENCE TO RELATED APPLICATIONS

This application is a 35 U.S.C. § 371 National Phase of PCT Application No. PCT/EP2023/058739, filed on Apr. 4, 2023, which claims priority to German Patent Application No. 10 2022 115 668.0, filed Jun. 23, 2022, the disclosures of each of which are hereby incorporated by reference herein in their entireties.

BACKGROUND

A phase-locked loop (PLL) is a control system in which an output phase of a voltage-controlled oscillator (VCO) can be automatically synchronized ("locked") to a phase of a periodic input signal. The periodic input signal commonly is referred to as an input reference clock. A PLL may be used in various applications e.g. sensor applications, communications and others.

SUMMARY

Concepts are being sought, by which a PLL having a reduced area and a high performance may be provided.

It is an object of the present invention to provide an improved phase-locked loop. The above object is achieved by the claimed matter according to the independent claims. Further developments are defined in the dependent claims.

According to embodiments, a phase-locked loop circuit comprises an analog part, an integral part, and a voltage controlled oscillator configured to receive a first current signal from the analog part and a second current signal from the integral part, and to output an output clock. The integral part is configured to receive a first and a second update signal each having at least one state based on a phase difference between an input clock and the output clock, the integral part comprising three integrator cells interconnected to form a ring oscillator.

The term "analog part" which is used in this disclosure may refer to a portion of the phase-locked loop circuit which comprises components which have been used in a classical analog PLL.

For example, each of the integrator cells may comprise a first digital input configured to receive a signal depending on the phase difference between the input clock and the output clock.

The phase-locked loop may further comprise a current generator that is electrically connected to at least one of the integrator cells. The current generator may form a component of the integral part.

The current generator may be configured to receive a first voltage signal from at least one of the integrator cells and to generate a first sub-signal of the second current signal, the first sub-signal being dependent on a phase difference between the input clock and the output clock.

According to embodiments, each of the integrator cells comprises a digital output connected to a second digital input of another one of the integrator cells. A digital output signal output by the digital output may indicate whether the first voltage signal output by the integrator cell is lower or higher than a first predetermined value.

For example, the phase-locked loop circuit may further comprise a counter. The digital output of at least one of the integrator cells may be further connected to the counter.

By way of example, the counter value of the counter may be changed in a first direction when the digital output signal indicates that the first voltage signal is changed to a value lower than the first predetermined value. For example, depending on the polarity of the used transistors of the current generator, the counter value may be increased when the digital output signal indicates that the first voltage signal is changed to a value lower than the first predetermined value. For example, in case the current generator comprises pMOS transistors, the counter value may be increased. When the current generator comprises nMOS transistors, the counter value may be decreased.

Further, the counter value of the counter may be changed in a second direction opposite to the first direction when the digital output signal indicates that the first voltage signal is changed to a value higher than the first predetermined value. For example, when the current generator comprises pMOS transistors, the counter values may be decreased. When the current generator comprises nMOS transistors, the counter value may be increased.

According to further embodiments, the digital output of a first one of the integrator cells in connected to the counter, and the counter value of the counter is changed in a first direction when the digital output signal indicates that the first voltage signal is changed to a higher value than the first predetermined value. In a similar manner as has been discussed above, depending on the polarity of the used transistors of the current generator, the counter value may be increased when the digital output signal indicates that the first voltage signal is changed to a value lower than the first predetermined value. For example, in case the current generator comprises pMOS transistors, the counter value may be increased. When the current generator comprises nMOS transistors, the counter value may be decreased.

The current generator may be configured to further receive a counter-signal from the counter and to generate a second sub-signal of the second current signal, the first and the second sub-signals being added. Accordingly, the current generator may act as a digital-analog converter (DAC).

For example, the current generator may be configured to generate a constant current when the phase difference is zero.

Each of the integrator cells may be configured to receive the digital output signal output from another one of the integrator cells and to set a level of the output voltage to second predetermined value, when the digital output signal indicates that the output voltage of the other one of the integrator cells is changed to a value lower than the first predetermined value.

For example, each of the integrator cells may be operable in a first oscillation mode or second oscillation mode. In the first oscillation mode the output voltage of the integrator cell may decline from the second predetermined value to Ground and in the second oscillation mode the output voltage of the integrator cell may rise from Ground to the second predetermined value.

For example, the oscillation mode may be selected on the basis of a detection result of the phase difference between the input clock and the output clock. By way of example, the first oscillation mode may be selected when the output clock lags the input clock, and the second oscillation mode may be selected when the output clock leads the input clock or vice versa.

An integrated circuit may comprise the phase-locked loop circuit which has been explained above.

An electronic device may comprise the phase-locked loop circuit which has been explained above.

For example, the electronic device may be selected from a sensor, an ambient light sensor, a time-of-flight sensor, a biomedical application or an electronic device for use in automotive applications.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

In the following detailed description reference is made to the accompanying drawings, which form a part hereof and in which are illustrated by way of illustration specific embodiments in which the invention may be practiced. In this regard, directional terminology such as "top", "bottom", "front", "back", "over", "on", "above", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

As employed in this specification, the terms "coupled" and/or "electrically coupled" are not meant to mean that the elements must be directly coupled together-intervening elements may be provided between the "coupled" or "electrically coupled" elements. The term "electrically connected" intends to describe a low-ohmic electric connection between the elements electrically connected together.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Figure 1:
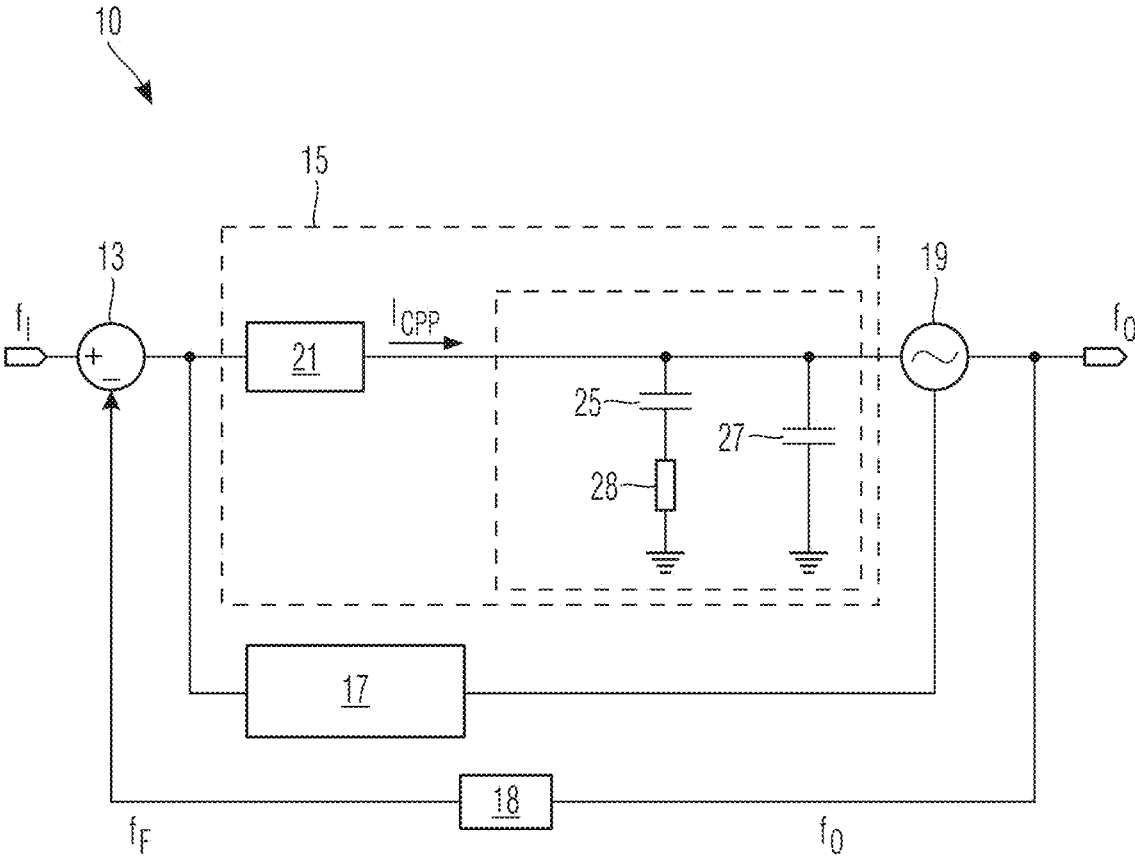
FIG. 1 is a schematic diagram illustrating a phase-locked loop according to embodiments.

FIG. 1 is a schematic diagram illustrating the general setup of a PLL 10 according to embodiments. The PLL 10 comprises a phase detector 13, an analog part 15 and an integral part 17. The phase detector 13 receives the input clock $f_I$ and a feedback signal $f_F$. For example, the feedback signal $f_F$ may correspond to an output clock $f_O$ output by a voltage-controlled oscillator (VCO) 19. According to further implementations, as will be explained below, the feedback signal $f_F$ may be a fraction of the output clock $f_O$.

The phase detector 13 generates an output signal depending on a phase difference between the input clock $f_I$ and the feedback signal $f_F$. The output signal of the phase detector 13 is set to the analog part 15 and the integral part 17. The analog part 15 may comprise a loop filter 23 and a charge pump 21. The charge pump 21 may be built in a generally known manner. For example, the loop filter 23 may comprise a first capacitor 25, a second capacitor 27 and a resistor 28.

The VCO 19 receives a first current signal from the analog part 15 and a second current signal from the integral part 17. Generally, the total gain of the VCO $K_{VCO}$ is divided into a proportional gain $K_P$ and an integral gain $K_I$ which is provided by the integral part 17. The integral part 17 may set the operating point (e.g. current for the VCO) and may be responsible for coarse tuning, while the analog part 15 is responsible for the fine tuning. With the integral part 17 added, the analog part 15 can have a lower gain $K_P$ which in turn allows smaller loop filter capacitors and consequently areas. The integral part 17 is designed to provide enough current for the VCO 19 while keeping a low VCO gain $K_I$. In this manner, the VCO gain $K_{VCO}$ may be set so that the desired frequency may be reached.

The VCO 19 may be a current starved ring voltage-controlled oscillator. The VCO 19 may also be implemented differently, e.g. as an LC oscillator (LC VCO). In case of an LC VCO, the voltage controls the frequency. For example, the VCO 19 may be configured to receive a current signal and to generate a frequency signal (output clock $f_O$) having a frequency that depends on the biased current.

A feedback loop couples the output clock $f_O$ generated by the VCO 19 via the optional feedback frequency divider 18 to the phase detector 13. The input clock $f_I$ is also applied to the frequency detector 13. The feedback frequency divider 18 may generate a feedback signal $f_F$ having a frequency that is a fraction of the frequency of the output clock $f_O$. The feedback signal $f_F$ and the input clock $f_I$ are input to the phase detector 13.

The phase detector 13 may be operable to generate a first error signal UP a second error signal DOWN indicating differences between the feedback signal $f_F$ and the input clock $f_I$. The first error signal UP indicates whether and to what extent the feedback signals $f_F$ lags the input clock $f_I$ and the second error signal DOWN indicates whether and to what extent the feedback signal $f_F$ leads the input clock $f_I$.

For example, the PLL may be a low bandwidth PLL which may mean that a bandwidth of the PLL may be in a range of a 1/10 of the frequency of the input clock.

Figure 2:
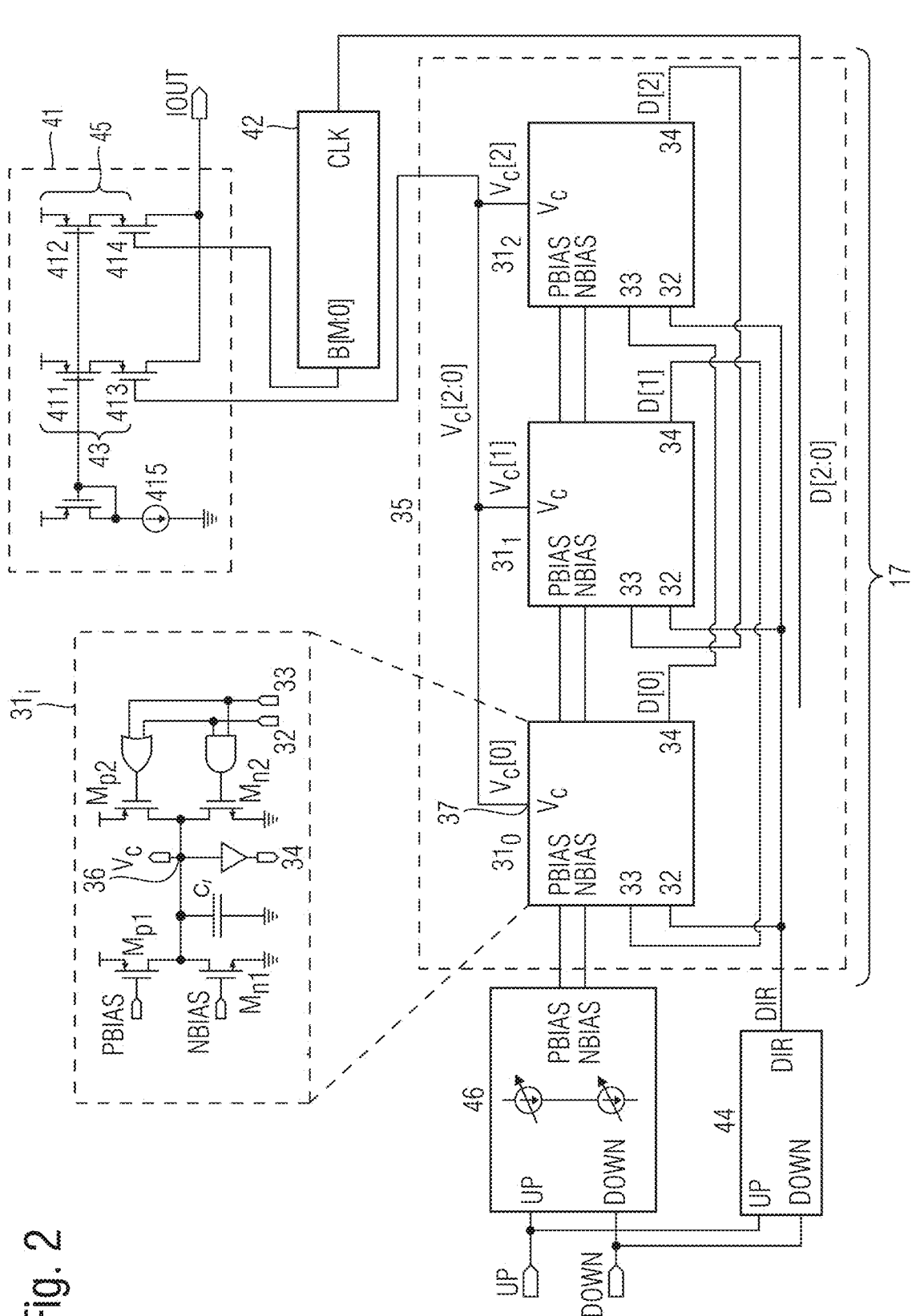
FIG. 2 illustrates components of the integral part in more detail.

FIG. 2 shows components of the integral part 17 in more detail. The integral part 17 generates a current $I_{OUT}$ having a value depending on the detected phase error. The integral part 17 comprises a charge pump 46, a direction detector circuit 44, a current generator 41, an up/down counter and decoder 42 and an integral core circuit 35. The integral core circuit 35 comprises three integrator cells 31 which are interconnected to form a ring oscillator. The PLL further comprises a current generator 41 comprising e.g. three analog cells 43 each of which is electrically connected to a corresponding one of the integrator cells 31.

The charge pump 46 is configured to receive UP and DOWN pulses that are input from the phase detector 13. The time delay between the pulses indicates the phase error. The charge pump 46 may comprise a current mirror. The voltages $P_{bias}$ and $N_{bias}$ are voltages generated by the current mirror of the charge pump 46. These voltages are used in the receiving transistors $M_{P1}$, $M_{N1}$ of the integrator cells 31$_i$. As a result, the current flowing through $M_{P1}$ and $M_{N1}$ is mirrored current of the charge pump 46. This current is used to build up a voltage $V_C$ on the capacitor C. In this way, $V_C$ is controlled by the PLL phase error. The voltage $V_C$ is connected to the control transistor 413 for analog part of a corresponding analog cell 43 of the current generator 41. As a consequence, the voltage $V_C$ is converted to current $I_{out}$ output by the current generator 41. As a consequence, the phase error controls the current of the integral part 17.

As illustrated in FIG. 2, each of the analog cells 43 of current generator 41 may comprise a current mirror that may determine currents of the current bias transistor 411. Current bias transistor 411 for analog part is connected in series to control transistor 413 for analog part. The gate electrode of the control transistor 413 is connected to $V_C$.

The current generator 41 may further comprise digital cells 45. The number M of digital cells 45 may correspond to the number of DAC (current generator) bits. A digital cell 45 comprises a current bias transistor 412 for digital part which is connected in series to control transistor (switch) 414 for digital part. Moreover, the gate electrode of the control transistor 414 is connected to the counter 42. Accordingly, a maximum current flowing through control transistors 413 or 414 is determined by the current generated in the current mirror and may be controlled by gate voltages applied to the gate electrodes of control transistor 413 for analog part and control transistor 414 for digital part, respectively.

As will be explained in the following, due to the specific setup shown in FIG. 2, the current generator 41 may be configured to generate a current having an analog portion and a digital portion. The digital portion of the current may be high in comparison with the analog portion, but it is not directly proportional to the phase error. In more detail, the digital portion of the current is controlled by the digital counter 42. Accordingly, for this portion, there may be no VCO gain or the VCO gain $K_I$ may be low.

The analog portion of the current may be low and it is proportional to the phase error. Accordingly, there is VCO gain $K_I$ for the analog portion of the current. According to the specific setup, the analog cell 43 of the current generator comprises a current mirror which is controlled by the integral core to generate an analog portion of the current which depends on the phase error. The digital cell 45 of the current generator 41 further comprises a current mirror which is controlled by the decoder 42 to generate a digital portion of the current. As will be discussed with reference to FIG. 3A, the digital portion of the current may be several times higher than the analog portion of the current. In this manner, a sufficiently high current may be generated for reaching the operating point of the VCO 19. In particular, there may be a low VCO gain $K_I$ of the integral part while at the same time achieving a sufficient current for reaching the operating point of the VCO. This achieved current is stable with respect to variation of process, voltage and temperature (PVT).

As is further shown, the integral core comprises three integrator cells 31$_1$, 31$_2$, and 31$_3$. At least three cells 31$_1$,

31$_2$, and 31$_3$ are used to provide a cell-sustaining oscillation. The cell-sustaining oscillator setup by the three integrator cells is controlled by the phase error (e.g. by UP and DOWN pulses) and has two modes of oscillations. Depending on a polarity of the phase error the integrator core oscillates from e.g. VDD to GND or vice versa. The polarity depends on whether UP is leading edge or DOWN is leading edge.

Each of the integrator cells 31$_i$ comprises a first digital input 32 and a second digital input 33. For example, the first digital input 32 may be configured to receive a signal depending on the phase difference between the input clock and the output clock $f_O$ or the feedback signal $f_F$.

Each of the integrator cells 31 may comprise a digital output 34 which is connected to a second digital input 33 of another one of the integrator cells. As a consequence, each of the integrator cells is controlling another one of the integrator cells. For example, the digital output 34 of integrator cell 31$_0$ is connected to the second input 33 of the third integrator cell 31$_2$. The digital output 34 of integrator cell 31$_1$ is connected to a second digital input 33 of the first integrator cell 31$_0$, and the digital output 34 of the third integrator cell 31$_2$ is connected to a second digital input 33 of the second integrator cell 31$_1$. Consequently, integrator cell 31$_0$ controls an integrator cell 31$_2$. Integrator cell 31$_1$ controls integrator cell 31$_0$, and integrator cell 31$_2$ controls integrator cell 31$_1$. Accordingly, the integrator cells are connected as a ring.

Depending on signals input to the first and second digital inputs, the voltage $V_C$ can be pre-charged to VDD or to GND. Pre-charging is needed to ensure spinning of the integrator cells 31$_i$ since all integrator cells 31$_i$ are used multiple times during operation, as will be explained later.

For example, the integral part 17 may further comprise a direction detector 44 that outputs a digital signal DIR in dependence of the UP and the DOWN signal. The direction detector 44 may detect leading edge, e.g. which edge is leading, UP or DOWN, and sets the DIR signal accordingly. For example, if DOWN is at a high level (i.e. the feedback signal $f_F$ leads the input clock $f_I$), the signal output by the direction detector 44 is set at a high level. If DOWN is at a low level (i.e. the feedback signal $f_F$ lags the input clock $f_I$), the signal output by the direction detector 44 is at a low level. The signal output DIR by the direction detector 44 is fed to the first digital input of each of the integrator cells 31$_1$. As will be explained below, depending on the DIR level, the oscillator mode of the integrator cells 31$_i$ is selected.

The digital output signal output by the digital output 34 may indicate whether a first voltage signal $V_C$ output by the integrator cell 31$_i$ is lower or higher than a first predetermined value, e.g. VDD/2. For example, as long as a voltage $V_C$ output by the integrator cell 31 is larger than e.g. VDD/2, the output signal output by the digital output 34 is set to HIGH. As long as the voltage output by the integrator cell is lower than VDD/2, the output signal output by the digital output 34 is LOW. The digital output 34 of all the integrator cells may further be connected to the counter 42. For example, on every falling edge of the output signal output by the digital output 34, the counter 42 is increased. Further, on every rising edge of the output signal output by the digital output 34, the counter 42 is decreased. Hence, the counter 42 is implemented as an up/down counter.

As is further illustrated in FIG. 2, each of the integrator cells 31$_1$ may comprise receiving transistors $M_{P1}$ and $M_{N1}$ that are controlled by the voltage signals $P_{bias}$ and $N_{bias}$, respectively, that are output by the charge pump 46. The source terminal of receiving transistor $M_{P1}$ may be connected to VDD, the source terminal of receiving transistor $M_{N1}$ may be connected to GND. The drain terminals of the receiving transistors $M_{N1}$ and $M_{P1}$ may be connected to a node 36 outputting the output voltage $V_C$.

The integrator cell may further comprise second transistors $M_{P2}$ and $M_{N2}$. The gate terminal of the transistor $M_{P2}$ may be connected to a NOR circuit connected to the first and second digital inputs 32, 33. A source terminal of transistor $M_{P2}$ may be connected to VDD. The gate terminal of transistor $M_{N2}$ may be connected to an AND circuit the inputs of which are connected to the first and second digital inputs 32, 33. A source terminal of transistor $M_{N2}$ is connected to ground. The drain terminals of the second transistors $M_{N2}$ and $M_{P2}$ may be connected to the node 36. The node 36 is connected to an analog output 37 that provides voltage $V_C$. The node 36 further is connected to the digital output 34.

Figure 3A:
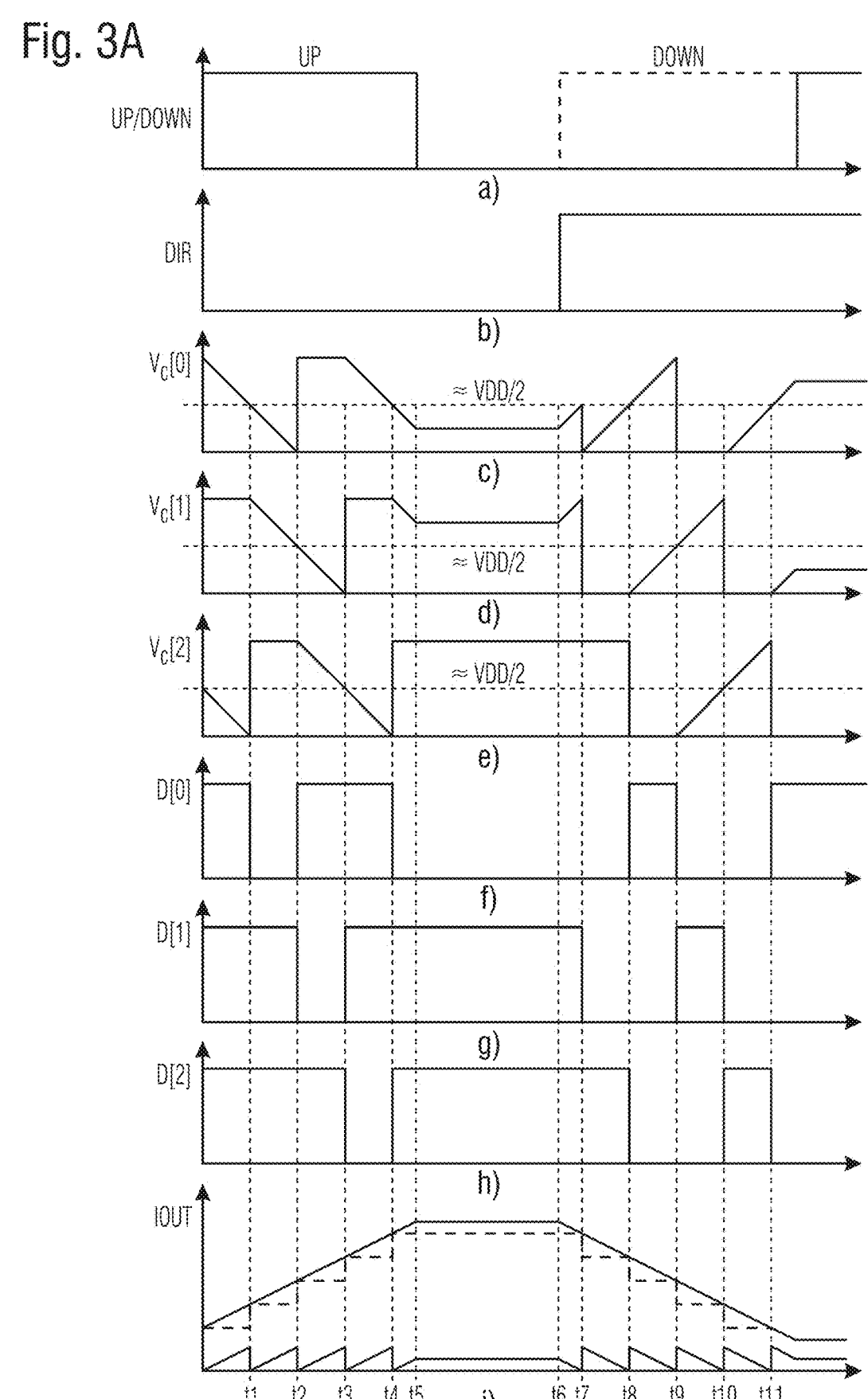
FIG. 3A shows waveforms generated by components of the phase-locked loop according to embodiments.

FIG. 3A illustrates various waveforms that may be generated during operation of the PLL described above. In particular, as is shown in graph a), from time t1 to t5 the first error signal UP is at a high level while the second error signal DOWN is at a low level. This means that phase error exists and the feedback signal $f_F$ lags the input clock $f_I$. In the time between t5 and t6 both error signals UP and DOWN are at low levels, indicating that no phase error exists and the system is in a locked state. Further, between t6 and t11, the second error signal DOWN is at a high level which means that the feedback signal $f_F$ leads the input clock $f_I$.

The upper portion of graph i) shows the output current $I_{OUT}$ of the current generator 41. The broken line indicates the digital portion of the generated current. The lower portion of graph i) shows the analog portion of the current. The current which is controlled by the control transistor 414 for digital part (and, hence, counter 42) is referred to as the digital portion of the current whereas the current which is controlled by the control transistor 413 for analog part (and, hence, voltage $V_C$ corresponding to the phase error) is referred to as the analog portion of the current.

Graph b) shows the output signal DIR of the direction detector 44. The output signal of the direction detector 44 is set at a high level when the second error signal DOWN is at a high level and the feedback signal $f_F$ leads the input clock $f_I$. When the direction detector 44 outputs a signal at a low level, the integrator cells $31_0$, . . . $31_2$ are pre-charged to VDD. When the direction detector 44 outputs a signal at a high level, the integrator cells $31_0$, . . . $31_2$ are pre-charged to GND.

Graph c) of FIG. 3A illustrates the behavior of the voltage $V_C[0]$ of the first integrator cell $31_0$. In the time from t0 to t1 the voltage $V_C[0]$ is declining. As a result, the current through the control transistor 413 for analog part of the corresponding analog cell 43 of the current generator 41 is increasing. Due to the presence of the current mirror in the current generator 41 the maximum current flowing through the control transistor 413 is limited by the current source 415. At t1, the voltage $V_C[0]$ reaches a first predetermined value, e.g. VDD/2. At this time, the maximum current through the control transistor 413 for the analog part is already reached. The first integrator cell enters the digital mode. Until t1, the first integrator cell $31_0$ was in the analog mode. While in digital mode, the integrator cell $31_1$ provides the same amount of current as the digital generator 41. Accordingly, the current bias transistors 411 and 412 may have the same size. When $V_C[0]$ trips the first predetermined value, e.g. VDD/2, the output signal at digital output 34 is set to low, as is also shown in graph f).

On every falling edge of the signal D[0], D[1] or D[2] output at the digital output 34, the value of the counter 42 is increased. As a consequence, the current generator 41 increases the digital current which is controlled by the control transistor 414 for digital part. The current amounts generated by control transistor 413 for the analog part and the control transistor 414 for the digital part are added and output the output current $I_{OUT}$ to the VCO 19. Accordingly, the current generator 41 may act as a digital-analog converter.

The signal D[0] generated by the first integrator cell $31_0$ is output to the third integrator cell $31_2$. As a result, the voltage $V_C[2]$ which is generated in the third integrator cell $31_2$ is pulled to VDD. As a consequence, the signal D[2] which is output by the third integrator cell $31_2$ to the second integrator cell $31_1$ is set to high level. In other words, as long as D[0] is at a low state, the integrator cell $31_2$ is turned off which means that there is no current flowing through the control transistor 413 for analog part of the corresponding analog cell 43 of the current generator 41.

Further, setting D[2] to high turns on the second integrator cell $31_1$ which is already pre-charged to VDD. Now the second integrator cell $31_1$ is in an active analog mode and generates the analog portion of the current between t1 and t2. In a similar manner as has been discussed with reference to the first integrator cell 310 in the time between to and t1, the voltage $V_0[1]$ is decreasing in the second integrator cell $31_1$. When the voltage $V_C[1]$ trips the first predetermined value, e.g. VDD/2, the output D[1] is pulled to low, the counter is increased and the digital current generated by the current generators is increased for 1 bit. Accordingly, at t2, the second integrator cell $31_1$ is in a digital mode. At the same time, $V_C[0]$ and D[0] are set to HIGH or VDD respectively, and the first integrator cell $31_0$ will be off as long as D[1] is low. At t2, since the first integrator cell $31_0$ controls the third integrator cell $31_2$ and D[0] is HIGH, the third integrator cell $31_2$ enters in an active analog modus, e.g. generates the analog portion of the current. Again, when $V_C[2]$, i.e. the voltage generated in the third integrator cell $31_2$ trips the first predetermined value, e.g. VDD/2, the third integrator cell $31_2$ is in a digital mode. In this case, D[2] is pulled to low, the counter is increased and the digital current of the current generator is increased for 1 bit. Now, the second integrator cell is off and the voltage is pulled to VDD, the first integrator cell $31_0$ is in an active analog mode and the whole process repeats as described.

The process will continue as long as the phase error exists. In other words, in the presence of a phase error, the cells are rotating. As soon as the first and the second error signals UP and DOWN have the same logic levels, this indicates that the PLL is locked. In this case, e.g. between t5 and t6, the process stops and the current generator provides a constant current as is shown in the timing of graphs i) and a) of FIG. 3A.

As has been described, during operation, i.e. as long as the first and the second error signals have different logic levels, one of the integrator cells is in an active analog mode, another one of the integrator cells is in a digital mode and a third one of the integrator cells is in an off mode. The integrator cell which is in the off mode is pre-charged to a second voltage value e.g. VDD and ready for use in the next cycle.

The timings from t6 to t11 illustrates a case in which the first error signal UP is low and the second error signal DOWN is high. The direction detector 44 sets a signal DIR to high. According to embodiments the direction detector 44 may comprise a time hysteresis to avoid possible ringing on the DIR output signal. Due to this setting of DIR, the integrator cells $31_0$ to $31_2$ are pre-charged to GND.

When any of the integrator cells is active in an analog mode, the output voltage $V_C$ is rising from GND to VDD. When the voltage trips the first predetermined value, e.g. VDD/2, the digital output signal D which is output via the digital output 34 is set to a high level. On a rising edge of the signal D the counter decreases the counter value. In a similar manner as has been discussed above, the first integrator cell $31_0$ controls the third integrator cell $31_2$, the second integrator cell $31_1$ controls the first integrator cell $31_0$ and the third integrator $31_2$ controls the second integrator cell $31_1$. As long as DIR is at HIGH, an integrator cell is first fully turned on and then enters to the digital mode and finally to the analog mode.

As has been described, there are two oscillation modes depending on whether the first and the second error signals UP and DOWN indicate that the feedback signal lags or leads the input clock. $V_C$ declines from a second predetermined value, e.g. VDD to GND or raises from GND to the second predetermined value, e.g. VDD.

Due to the combination of the above-described integral part 17 with an analog part 15 comprising e.g. two transistors 25, 27 and one resistor 28 the PLL is more robust than known devices. In particular, due to the presence of the analog part 15 there is no strict requirement for current matching in the current generator because the analog part always has some gain which provides current to the VCO. This gain is sufficient to cover possible current mismatch from the current generator.

Figure 3B:
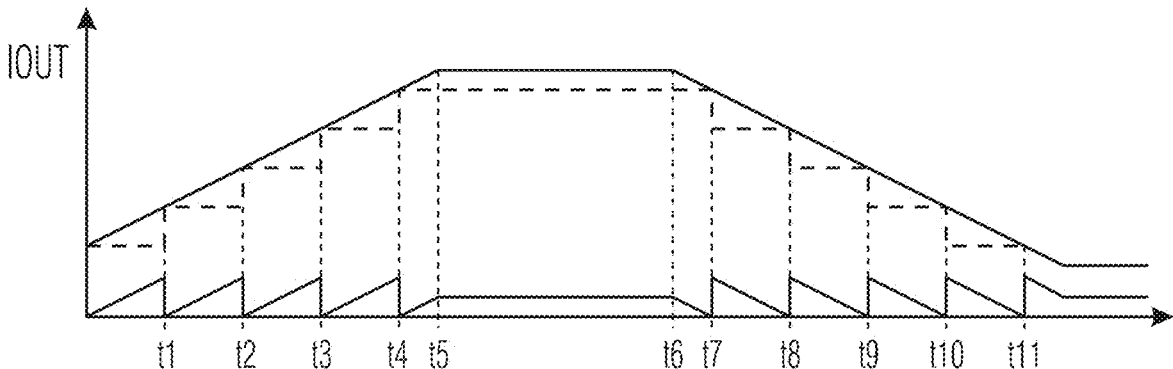
FIG. 3B illustrates a waveform of a current characteristic in more detail.

FIG. 3B shows an example of the current signal output by the current generator at different timings. The current signal illustrated in FIG. 3B is an enlarged view of graph i) illustrated in FIG. 3A so that a detailed description thereof is omitted. Due to the presence of the digital portion of the current IOUT, the current may have a large value. Due to the large value of the current, the operating point of the VCO 19 may be reached even though the current value indicating the phase difference and determining the output clock $f_O$ is comparably low. In particular, due to the presence of the digital portion of the current, the gain of the VCO 19 may be set to a comparatively low value. As a consequence, the capacitor 25 which is e.g. shown in FIG. 1 can be small. As a result, the space requirements are reduced.

Figure 4:
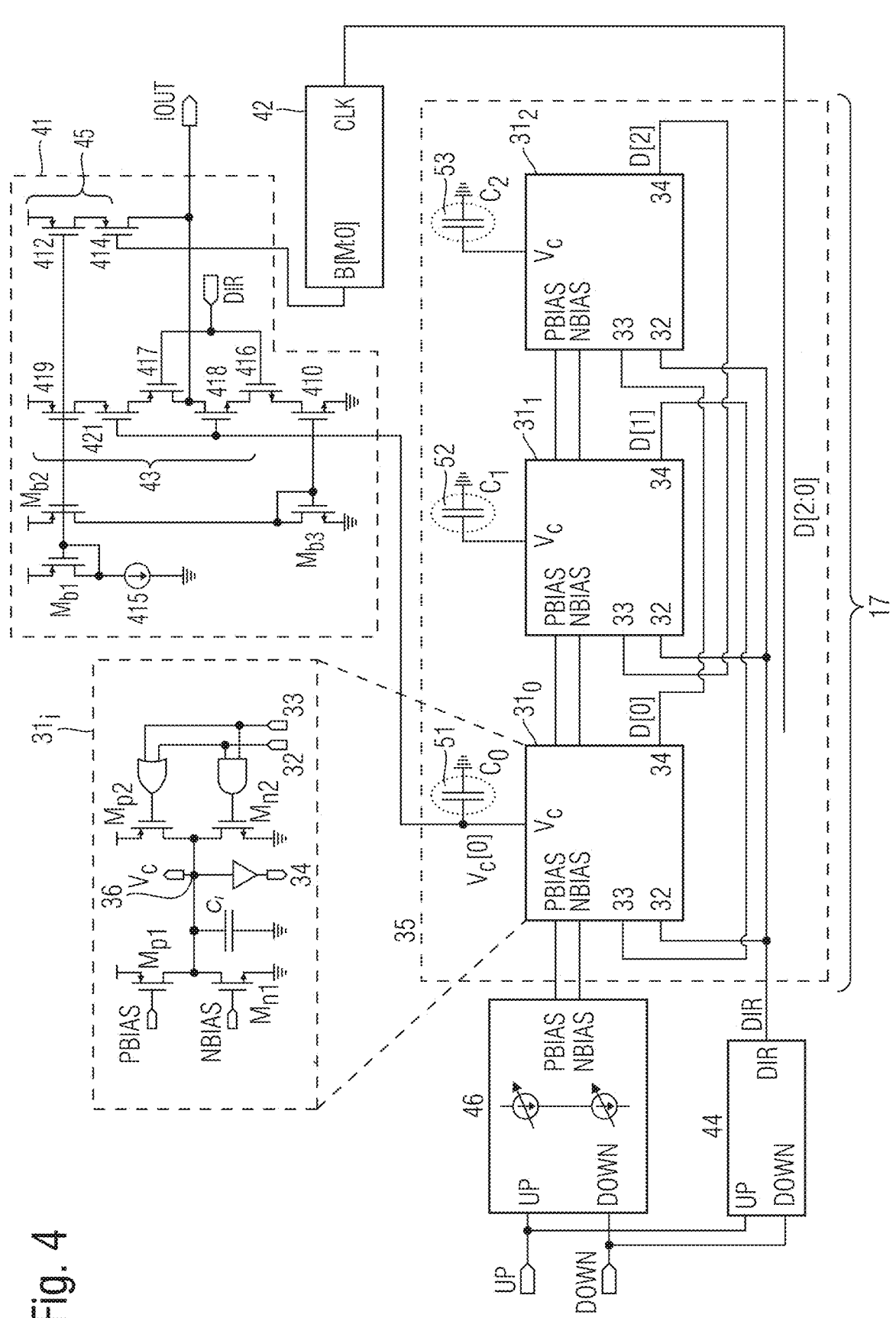
FIG. 4 illustrates components of a phase-locked loop according to further embodiments.

FIG. 4 illustrates an integral part 17 of the PLL according to further embodiments. The integral part 17 illustrated in FIG. 4 comprises similar components as the integral part 17 shown in FIG. 2. Differing from the integral part shown in FIG. 2, only the first integrator cell $31_0$ is connected to the current generator 41. Accordingly, only the first integrator cell $31_0$ is used to control the analog portion of the current. Consequently, the current generated by the current generator 41 is changed only on a rising edge of D[0] output by the first integrator cell $31_0$. The current generator 41 may comprise only one analog cell 43 and a plurality of digital cells 45. Each of the digital cells 45 may comprise a current bias transistor 412 for digital part and a control transistor 414 for digital part. The number M of the digital cells may correspond to the number of bits of the DAC. The analog cell 43 may be in an analog or in an off mode.

When DIR is low, the transistor 416 is off. Transistor 416 corresponds to an enable sink transistor, which may enable sink of the analog current. When DIR is low, the transistor 417 is on. Transistor 417 is an enable source transistor, that may enable source of the analog current. As a consequence, current is pushed to the pin IOUT and the overall current rises as long as there is phase difference (e.g. UP is high and DOWN is low). The control voltage Vc[0] controls the control source transistor 421, and in that way the amount of current which will be pushed to IOUT. The maximum current is in a similar manner as described above with reference to FIG. 2 limited by transistor 419. When the DIR signal is high, the enable sink transistor 416 is on and enable source transistor 417 is off which means the analog current is pulled out from the node IOUT. This leads to the decrease of current. In same way as has been described above, the signal Vc[0] controls the transistor 418 reducing the current through the transistor and by that through IOUT. The transistors 419, Mb2, Mb3 and 410 may be adjusted to have same amount current flowing through 419 and 410.

The integrator cells $31_i$ shown in FIG. 4 may be similar to the integrator cells $31_i$ shown in FIG. 2. The capacitors 51, 52, and 53 may be arranged behind the node 36. The capacitance of the capacitors 52 and 53 may be considerably smaller than the capacitance of capacitor 51 that is connected to the current generator 41. Accordingly, the space of the integral part 17 may be reduced.

A PLL comprising the integrator part 71 shown in FIG. 4 has a reduced area.

Figure 5A:
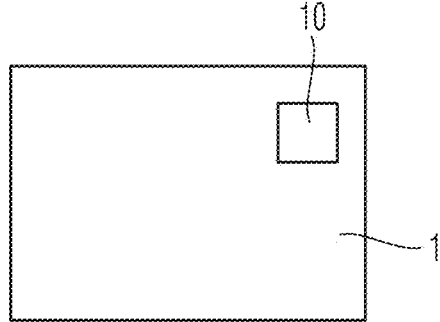
FIG. 5A shows a schematic view of an integrated circuit according to embodiments.

FIG. 5A shows an integrated circuit 1 according to embodiments. The integrated circuit 1 comprises the phase-locked loop circuit 10 that has been explained above. Since the phase-locked loop circuit 10 has a reduced area, the integrated circuit 1 may be a SOIC ("Small outline integrated circuit").

Figure 5B:
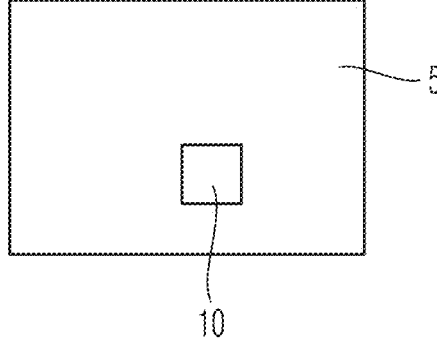
FIG. 5B shows a schematic view of an electronic device according to embodiments.

FIG. 5B shows an electronic device 5 comprising the phase-locked loop circuit 10 that has been explained above. For example, the phase-locked loop circuit 10 may be used in sensor front-ends that require a small area high performance phase-locked loop. Accordingly, the electronic device 5 may be a sensor, e.g. an ambient light sensor, a time-of-flight sensor, a biomedical application or an electronic device for use in automotive applications.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

LIST OF REFERENCES 1 integrated circuit
5 electronic device
10 phase-locked loop
13 phase/frequency detector
15 analog part
17 integral part
18 feedback frequency divider
19 voltage controlled oscillator
21 charge pump of analog part
23 loop filter of analog part
25 capacitor
27 capacitor
28 resistor
$31_1$, $31_2$, . . . $31_N$ integrator cell
32 first digital input
33 second digital input
34 digital output
35 integral core
36 node
37 analog output
41 current generator
410 bias sink transistor 411 current bias transistor for analog part
412 current bias transistor for digital part
413 control transistor for analog part
414 control transistor for digital part
415 current source
416 enable sink transistor
417 enable source transistor
418 control sink transistor
419 bias source transistor
42 counter
421 control source transistor
43 analog cell
44 direction detector
45 digital cell
46 charge pump
$f_I$ input clock
$f_O$ output clock
feedback signal
UP first update signal
DOWN second update signal

The invention claimed is:

1. A phase-locked loop circuit, comprising:
an analog part;
an integral part; and
a voltage controlled oscillator configured to receive a first current signal from the analog part and a second current signal from the integral part, and to output an output clock;
the integral part being configured to receive a first and a second update signal each having at least one state based on a phase difference between an input clock and the output clock, the integral part comprising three integrator cells interconnected to form a ring oscillator.

2. The phase-locked loop circuit according to claim 1, wherein each of the integrator cells comprises a first digital input configured to receive a signal depending on the phase difference between the input clock and the output clock.

3. The phase-locked loop circuit according to claim 1, further comprising a current generator electrically connected to at least one of the integrator cells.

4. The phase-locked loop circuit according to claim 3, wherein the current generator is configured to generate a constant current when the phase difference is zero.

5. The phase-locked loop circuit according to claim 3, wherein the current generator is configured to receive a first voltage signal from at least one of the integrator cells and to generate a first sub-signal of the second current signal, the first sub-signal being dependent on the phase difference between the input clock and the output clock.

6. The phase-locked loop circuit according to claim 5, wherein each of the integrator cells comprises a digital output connected to a second digital input of another one of the integrator cells, a digital output signal output by the digital output indicating whether the first voltage signal output by the integrator cell is lower or higher than a first predetermined value.

7. The phase-locked loop circuit according to claim 6, wherein each of the integrator cells is configured to receive the digital output signal output from another one of the integrator cells and to set a level of an output voltage to a second predetermined value, when the digital output signal indicates that the output voltage of the other another one of the integrator cells is changed to a value lower than the first predetermined value.

8. The phase-locked loop circuit according to claim 7, wherein each of the integrator cells is operable in a first oscillation mode or second oscillation mode, wherein in the first oscillation mode the output voltage of the integrator cell declines from the second predetermined value to Ground and in the second oscillation mode the output voltage of the integrator cell rises from the Ground to the second predetermined value.

9. The phase-locked loop circuit according to claim 6, further comprising a counter, wherein the digital output of at least one of the integrator cells is further connected to the counter.

10. The phase-locked loop circuit according to claim 9, wherein the digital output of a first one of the integrator cells in connected to the counter, and a counter value of the counter is changed in a first direction when the digital output signal indicates that the first voltage signal is changed to a higher value than the first predetermined value.

11. The phase-locked loop circuit according to claim 9, wherein a counter value of the counter is changed in a first direction when a respective digital output signal indicates that the first voltage signal is changed to a first value lower than the first predetermined value.

12. The phase-locked loop circuit according to claim 11, wherein the counter value of the counter is changed in a second direction opposite to the first direction when the respective digital output signal indicates that the first voltage signal is changed to a second value higher than the first predetermined value.

13. The phase-locked loop circuit according to claim 11, wherein the current generator is configured to further receive a counter-signal from the counter and to generate a second sub-signal of the second current signal, the first sub-signal and the second sub-signal being added.

14. An integrated circuit, comprising:
a phase-locked loop circuit comprising:
an analog part;
an integral part; and
a voltage controlled oscillator configured to receive a first current signal from the analog part and a second current signal from the integral part, and to output an output clock;
the integral part being configured to receive a first and a second update signal each having at least one state based on a phase difference between an input clock and the output clock, the integral part comprising three integrator cells interconnected to form a ring oscillator.

15. An electronic device, comprising:
a phase-locked loop circuit comprising:
an analog part;
an integral part; and
a voltage controlled oscillator configured to receive a first current signal from the analog part and a second current signal from the integral part, and to output an output clock;
the integral part being configured to receive a first and a second update signal each having at least one state based on a phase difference between an input clock and the output clock, the integral part comprising three integrator cells interconnected to form a ring oscillator.

16. The electronic device according to claim 15, which is selected from a sensor, an ambient light sensor, a time-of-flight sensor, a biomedical application, or an electronic device for use in automotive applications.

* * * * *